United States Patent
Kurata

(10) Patent No.: US 9,480,195 B2
(45) Date of Patent: Oct. 25, 2016

(54) METHOD OF MANUFACTURING MOUNTING SUBSTRATE

(71) Applicant: Panasonic Corporation, Osaka (JP)

(72) Inventor: Hiroaki Kurata, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 378 days.

(21) Appl. No.: 14/008,129

(22) PCT Filed: Mar. 4, 2013

(86) PCT No.: PCT/JP2013/001329
§ 371 (c)(1),
(2) Date: Sep. 27, 2013

(87) PCT Pub. No.: WO2014/030270
PCT Pub. Date: Feb. 27, 2014

(65) Prior Publication Data
US 2014/0290055 A1  Oct. 2, 2014

(30) Foreign Application Priority Data

Aug. 22, 2012 (JP) .................................. 2012-182918

(51) Int. Cl.
*H05K 13/08* (2006.01)
*H05K 13/04* (2006.01)

(52) U.S. Cl.
CPC ............. *H05K 13/08* (2013.01); *H05K 13/04* (2013.01); *Y10T 29/4913* (2015.01)

(58) Field of Classification Search
CPC ................... Y10T 29/4913; H05K 13/08
USPC ........ 29/832–841, 739–741, 33 M, 593, 729
See application file for complete search history.

(56) References Cited

U.S. PATENT DOCUMENTS

| | | | |
|---|---|---|---|
| 5,581,486 A | | 12/1996 | Terada et al. |
| 6,002,650 A | * | 12/1999 | Kuribayashi ...... G05B 19/4097 29/703 |
| 6,494,671 B1 | * | 12/2002 | Takaiti ................. H05K 13/021 414/396 |

(Continued)

FOREIGN PATENT DOCUMENTS

| | | |
|---|---|---|
| CN | 1728933 A | 2/2006 |
| CN | 101815429 A | 8/2010 |

(Continued)

OTHER PUBLICATIONS

International Search Report for Application No. PCT/JP2013/001329 dated Apr. 23, 2013.

(Continued)

*Primary Examiner* — Peter DungBa Vo
*Assistant Examiner* — Kaying Kue
(74) *Attorney, Agent, or Firm* — Pearne & Gordon LLP

(57) ABSTRACT

In error coping executed when it is determined that an electronic component is a different type of component which is not a regular electronic component to be supplied from a part feeder in a component mounting process, production operation of the component mounting device is stopped, a component set timing at which the different type of component is set is specified on the basis of component set history information, all of the substrates to be target of production by the component mounting device after a specified component set timing are specified as substrates to be managed on which the different type of components are potentially mounted, and the production operation of all of the devices arranged downstream, and intended to produce the substrates to be managed is stopped.

6 Claims, 9 Drawing Sheets

(56) References Cited

U.S. PATENT DOCUMENTS

| | | | | |
|---|---|---|---|---|
| 6,778,878 | B1* | 8/2004 | Kou | H05K 13/0417 700/221 |
| 6,779,726 | B1* | 8/2004 | Easton | H05K 13/0417 235/462.01 |
| 7,896,553 | B2* | 3/2011 | Sahashi | B60B 27/00 384/448 |
| 8,033,913 | B2* | 10/2011 | Cockerille | G07F 17/323 463/20 |
| 2002/0069395 | A1* | 6/2002 | Fujiwara | H05K 13/08 716/112 |
| 2003/0078676 | A1* | 4/2003 | Kuribayashi | G05B 19/4097 700/1 |
| 2005/0071997 | A1* | 4/2005 | Oyama | H05K 13/0413 29/832 |
| 2006/0020361 | A1 | 1/2006 | Ohishi et al. | |
| 2006/0079984 | A1 | 4/2006 | Ohishi et al. | |
| 2015/0107088 | A1* | 4/2015 | Sagara | G06Q 10/06311 29/592.1 |
| 2015/0173205 | A1* | 6/2015 | Maenishi | G05B 19/41865 29/832 |

FOREIGN PATENT DOCUMENTS

| | | |
|---|---|---|
| EP | 2355646 A2 | 8/2011 |
| JP | 6-169192 A | 6/1994 |
| JP | 10-065399 A | 3/1998 |
| JP | 2003-071660 A | 3/2003 |
| JP | 2004-021281 A | 1/2004 |
| JP | 2007-109779 A | 4/2007 |
| JP | 2008-078235 A | 4/2008 |
| JP | 2011-159699 A | 8/2011 |

OTHER PUBLICATIONS

Chinese Office Action for Application No. 201380000990.2 dated Jun. 1, 2016.

* cited by examiner

*FIG. 6A*

| PRODUCTION DATA | TARGET SUBSTRATE TYPE (B1) | |
|---|---|---|
| FEEDER ADDRESS | FEEDER ID CODE | COMPONENT ID CODE |
| f1 | Faaaa | Pbbbb |
| f2 | | |
| f3 | | |
| ⋮ | | |

*FIG. 6B*

| COMPONENT SET HISTORY INFORMATION | | | | |
|---|---|---|---|---|
| FEEDER ADDRESS | FEEDER ID CODE | COMPONENT ID CODE | COMPONENT SET TIMING | CORRESPONDING SUBSTRATE ID CODE |
| f1 | Faaaa | Pbbbb | Tssss | B1nnnn |
| f2 | | | | |
| f3 | | | | |
| ⋮ | | | | |

*FIG. 6C*

| CHECKING HISTORY INFORMATION | | | | |
|---|---|---|---|---|
| FEEDER ADDRESS | FEEDER ID CODE | COMPONENT ID CODE | CHECKING TIMING | CORRESPONDING SUBSTRATE ID CODE |
| f1 | Faaaa | Pbbbb | Tcccc | B1mmmm |
| f2 | | | | |
| f3 | | | | |
| ⋮ | | | | |

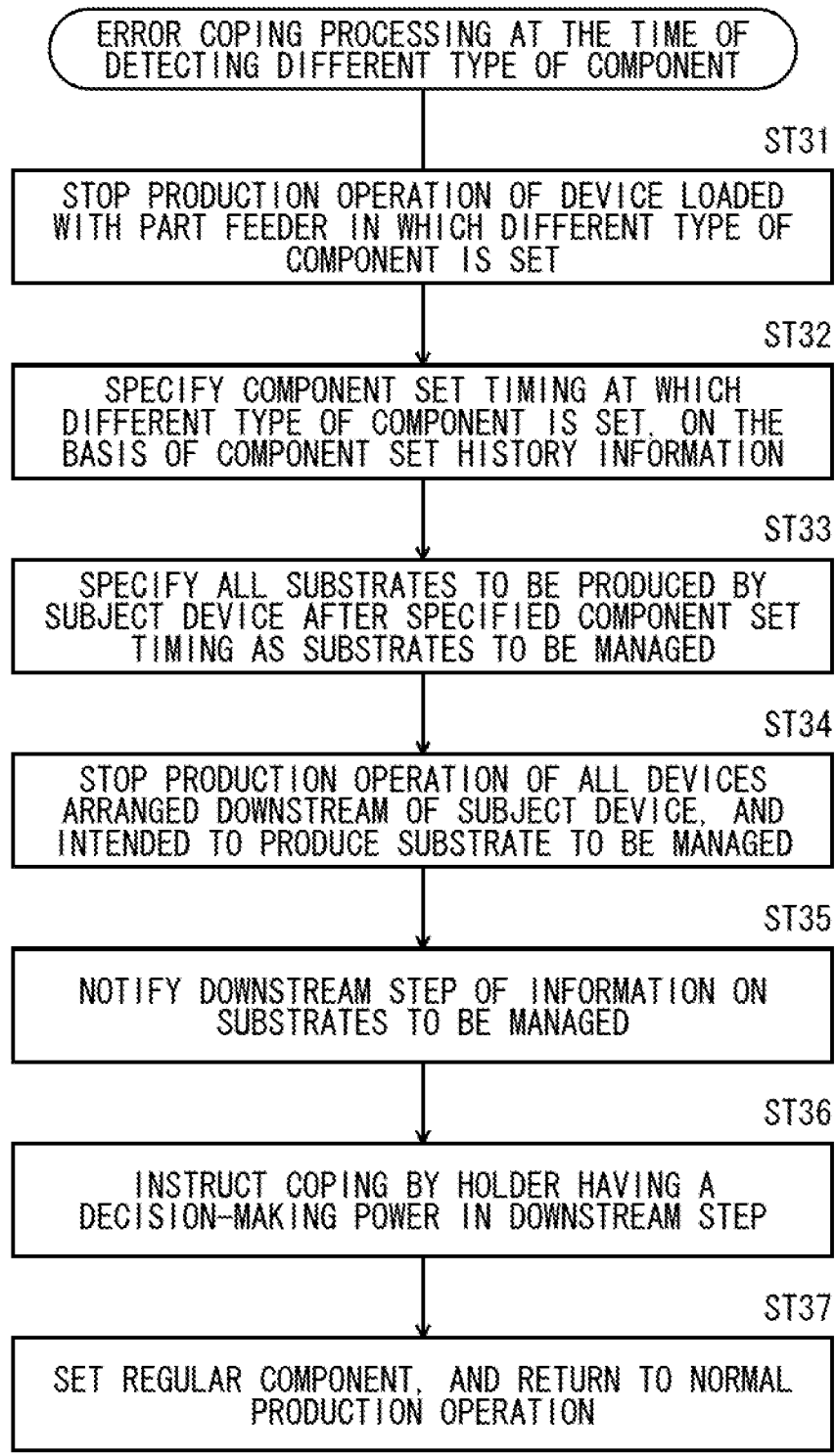

METHOD OF MANUFACTURING MOUNTING SUBSTRATE

TECHNICAL FIELD

The present invention relates to a manufacturing method for a mounting substrate which manufactures a mounting substrate by mounting electronic components on a substrate.

BACKGROUND ART

The mounting substrate on which electronic components are mounted is manufactured by a component mounting line configured by coupling a plurality of component mounting devices to each other, in which the substrate is transported on a component mounting line from an upstream side toward a downstream side whereby a plurality of electronic components are sequentially mounted on the substrate by the respective component mounting devices. In a component supply unit of the component mounting devices, a plurality of part feeders such as tape feeders are disposed in parallel for each of component types. When a plurality of substrate types are to be produced, because a required component type is different according to the substrate type, a feeder position change associated with the replacement or addition of the part feeder is executed as a production preparation work every time the substrate type is switched to another. The feeder position change is executed on the basis of production data created in advance according to the type of substrate. After the feeder position change has been finished, or component replenishment is executed during execution of the production, it is confirmed whether an electronic component set actually matches a component type defined in the production data, or not (for example, refer to Patent Literature 1). In the prior art disclosed in this Patent Literature, identification information affixed to the part feeder is read and checked against the production data to detect erroneous insertion of the part feeder. If the erroneous insertion is detected, an alarm indicative of this fact is issued, and the operation of the mounting device stops, thereby preventing the occurrence of the erroneous mounting in which another type of component different from a regular component is erroneously mounted.

CITATION LIST

Patent Literature

Patent Literature 1: JP-A-H10 (1998)-65399

SUMMARY OF INVENTION

Technical Problem

However, in the conventional art including the above-mentioned prior art example, a function design of a production facility has been conducted assuming that a worker makes an effect to prevent an abnormal situation as much as possible while complying with operation rules. For that reason, when the operator conducts an omission of duty against an operation rule, intentionally or unintentionally, the above-mentioned erroneous mounting prevention function does not effectively function, resulting in the occurrence of the erroneous mounting. When the production is continuously executed while a proper treatment is not conducted on the above erroneous mounting, defective substrates are fed to a downstream process, resulting in a situation where defective products may be shipped. That is, even if the setting of the different type of components is found at some time point, there is nothing to specify when the abnormal situation such as the setting of the different type of component starts. Therefore, it is difficult to clarify to what extent this influence reaches in the downstream process. In this way, in manufacturing the mounting substrate with the conventional component mounting line, a coping method when the erroneous setting of the electronic components is found out is not definitely specified, resulting in such a problem that it is difficult to prevent poor quality caused by erroneous mounting.

Under the circumstances, the present invention aims at providing a method of manufacturing a mounting substrate which definitely specifies the coping method when the erroneous setting of the electronic component is found, thereby being capable of preventing the poor quality caused by the erroneous mounting.

Solution to Problem

A mounting substrate manufacturing method of the invention for manufacturing a mounting substrate by sequentially mounting a plurality of electronic components on a substrate by a component mounting line in which a plurality of component mounting devices that extract the electronic components from a component supply unit on which a plurality of part feeders are loaded, and mount the electronic components on the substrate are coupled to each other, the mounting substrate manufacturing method comprises:

a component set history information storing step of storing identification information on the electronic components supplied by the part feeders, loading positions of the part feeders, and a component set timing at which the electronic components are set in the part feeders linked with each other as component set history information, for each of the part feeders loaded in the component supply unit in a component mounting process intended for one substrate type;

a checking history information storing step of detecting identification information on the electronic components, and checking the identification information against production data to determine whether the electronic components are regular electronic components to be supplied from the part feeders loaded at the loading positions, or not, and storing the identification information on the electronic components, the loading positions, and the checking timing at which the checking is executed on the part feeders linked with each other as the checking history information if it is determined that the electronic component is the regular electronic component, for each of the part feeders loaded in the component supply unit at a preset given timing in the component mounting process; and an error coping step which is executed when it is determined that the electronic component is a different type of component which is not the regular electronic component to be supplied from the part feeder loaded at the loading position, at the preset given timing, wherein the error coping step includes:

a first device stopping step of stopping production operation of the component mounting device in which the part feeders in which the different type of components is set is loaded;

a timing specifying step of specifying the component set timing at which the different type of component is set, on the basis of the component set history information;

a substrate specifying step of specifying all of the substrates to be target of production by the component mounting device after the specified component set timing as substrates to be managed on which the different type of component is potentially mounted; and a second device stop step of stopping the production operation of all the component mounting devices which are arranged downstream of the component mounting device, and which are intended to produce with the substrates to be managed.

Advantageous Effects of Invention

According to the present invention, in an error coping step which is executed when it is determined that the electronic component is the different type of component which is not the regular electronic component to be supplied from the part feeder loaded at the loading position at a predetermined given timing in the component mounting process, the production operation of the component mounting device loaded with the part feeder in which the different type of component is set is stopped, the component set timing at which the different type of component is set is specified on the basis of the component set history information, all of the substrates to be target of production by the component mounting device after the specified component set timing are specified as the substrates to be managed on which the different type of components are potentially mounted, and the production operation of all of the component mounting devices arranged downstream of the above component mounting device and intended to produce the substrates to be managed is stopped. As a result, the coping method when the erroneous set of the electronic components is found is definitely specified, and the poor quality caused by the erroneous mounting can be prevented.

BRIEF DESCRIPTION OF DRAWINGS

FIGS. 6A to 6C are illustrative views of a configuration of production data and history information used in component mounting in the method of manufacturing the mounting substrate according to the embodiment of the present invention.

FIG. 9 is a flowchart illustrating error coping processing when detecting another type of component in the method of manufacturing the mounting substrate according to the embodiment of the present invention.

DESCRIPTION OF EMBODIMENTS

Figure 1:
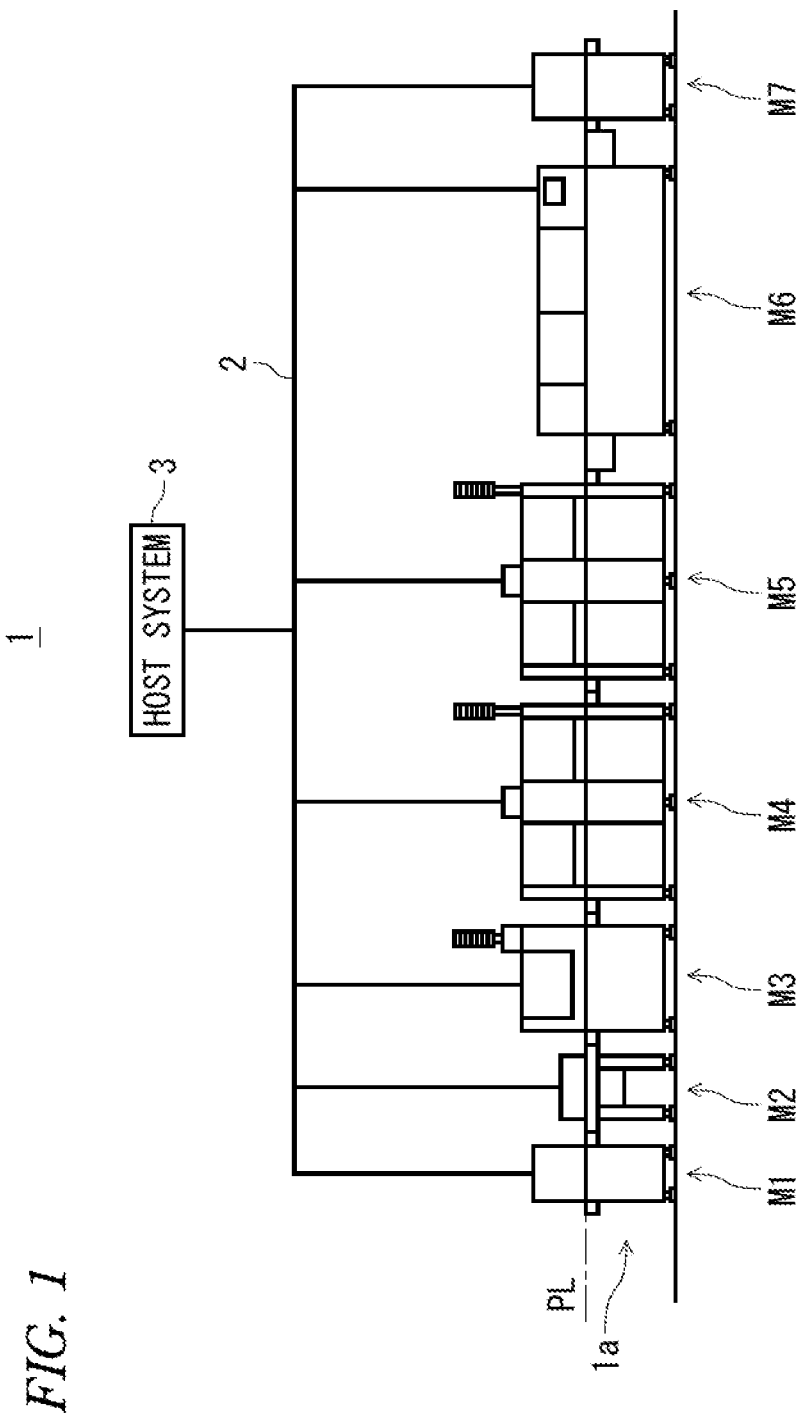
FIG. 1 is an illustrative diagram of a configuration of an electronic component mounting system used in a method of manufacturing a mounting substrate according to an embodiment of the present invention.

Subsequently, embodiments of the present invention will be described with reference to the drawings. First, a configuration of an electronic component mounting system 1 will be described with reference to FIG. 1. The electronic component mounting system 1 has a function of mounting an electronic component on a substrate to produce a mounting substrate. The electronic component mounting system 1 is based mainly on a component mounting line 1a in which a solder printing device M3, component mounting devices M4, M5, and a reflow device M6, which are a plurality of devices for mounting electronic components, are coupled in series with each other between a substrate supply device M1, a substrate delivery device M2, and a substrate recovery device M7 having functions of supplying, delivering, and recovering substrates to be mounted, respectively.

The respective devices of the substrate supply device M1 to the substrate recovery device M7 are connected to a host system 3 having a management computer through a communication network 2. Substrate transport mechanisms installed in the respective devices of the component mounting line 1a are connected in series with each other to form a substrate transport path having the same pass line PL. In the component mounting operation, the component mounting operation for mounting an electronic component on a substrate 6 (refer to FIGS. 2 and 3) transported along the substrate transport path is conducted by the solder printing device M3, the component mounting devices M4, M5, and the reflow device M6.

That is, the substrate 6 supplied by the substrate supply device M1 is carried in the solder printing device M3 through the substrate delivery device M2, in which the solder printing operation that screen-prints a component junction solder on the substrate 6 is conducted. The substrate 6 that has been solder-printed is sequentially delivered to the component mounting devices M4 and M5, in which the component mounting operation for mounting the electronic component on the substrate 6 has been solder-printed is executed. Then, the substrate 6 on which the component has been mounted is carried in the reflow device M6, in which the component junction solder is melted and solidified by heating according to a given heating profile. As a result, the electronic component is joined to the substrate 6 by soldering, the mounting substrate where the electronic component has been mounted on the substrate 6 is completed, and recovered by the substrate recovery device M7.

Figure 2:
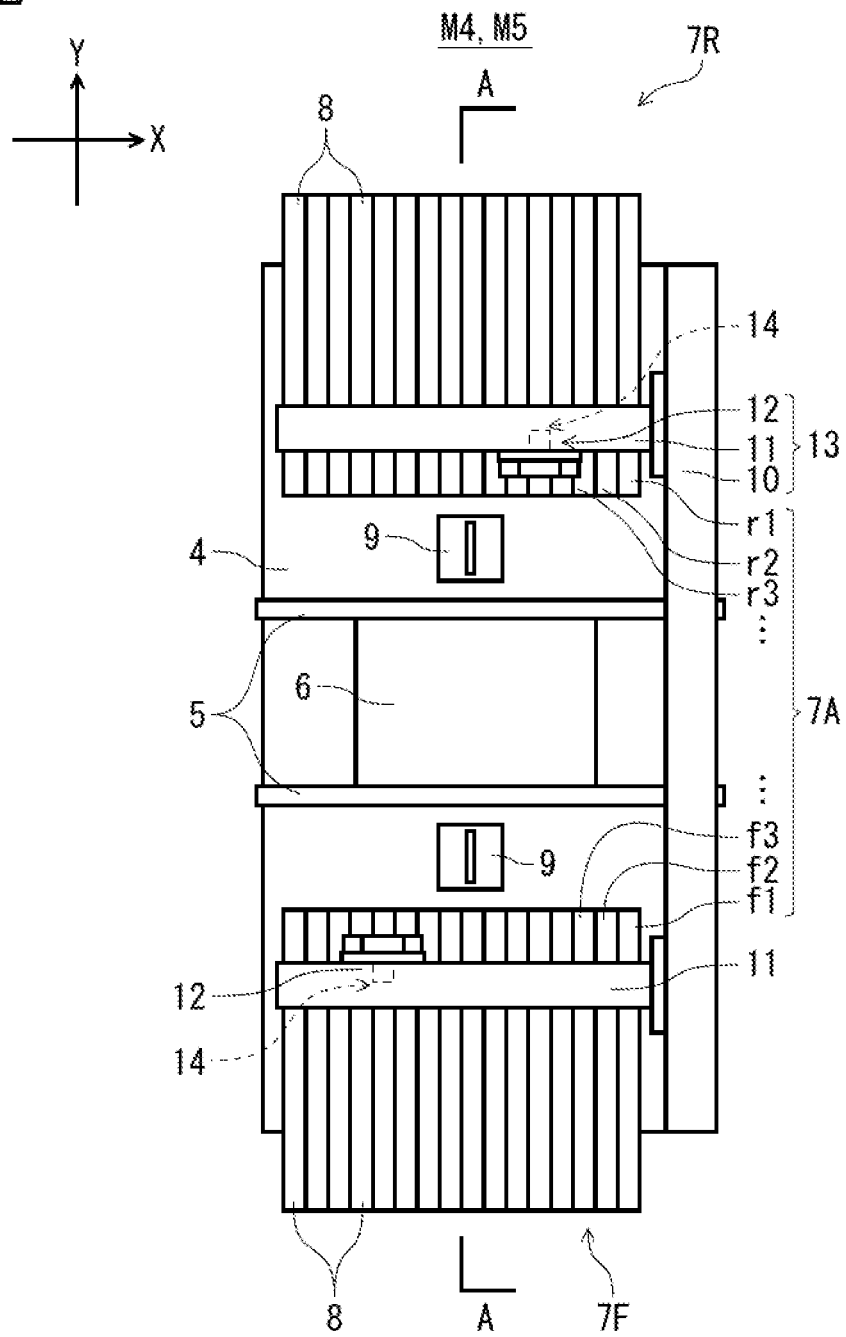
FIG. 2 is a plan view of a component mounting device used in the method of manufacturing the mounting substrate according to the embodiment of the present invention.
Figure 3:
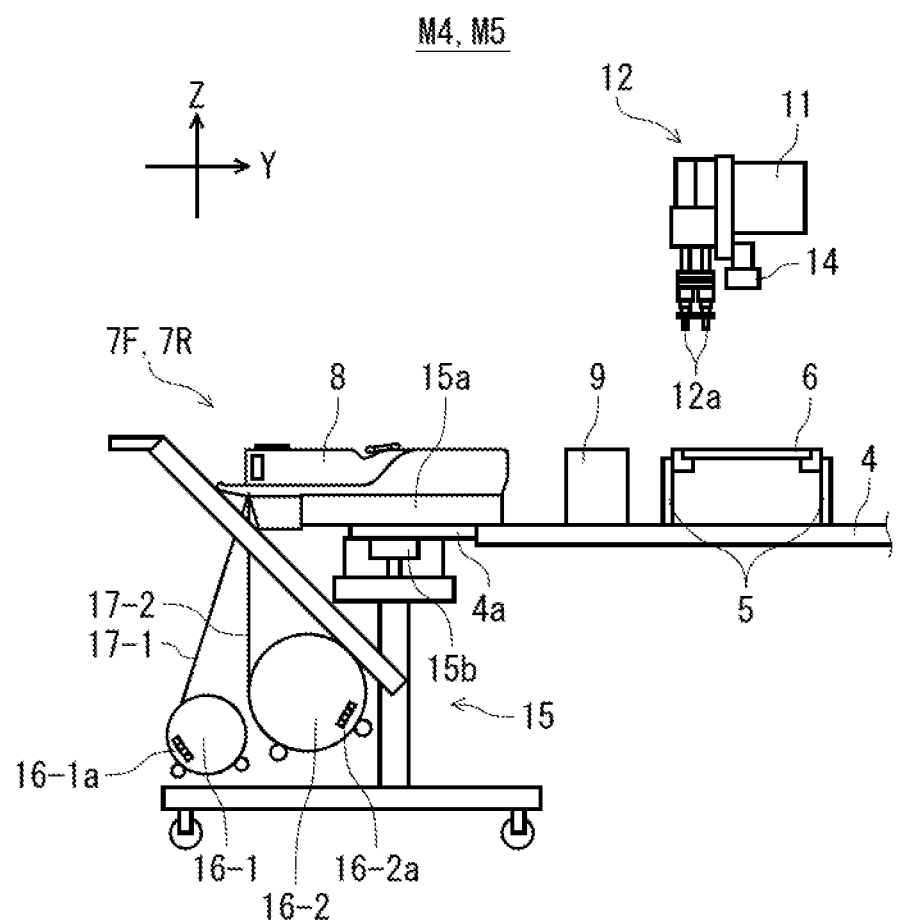
FIG. 3 is a partially cross-sectional view of the component mounting device used in the method of manufacturing the mounting substrate according to the embodiment of the present invention.

Subsequently, a structure of the component mounting devices M4 and M5 will be described with reference to FIGS. 2 and 3. FIG. 3 illustrates a cross-section A-A in FIG. 2. As illustrated in FIG. 2, a substrate transport mechanism 5 is arranged on a base 4 in an X-direction. The substrate transport mechanism 5 transports the substrate 6 on which the electronic component has been mounted by a conveyor, and positions the substrate 6 at a mounting operation position disposed on the substrate transport mechanism 5.

A component supply unit 7F is disposed at a front side of the substrate transport mechanism 5, and a component supply unit 7R is disposed on a rear side of the substrate transport mechanism 5. A plurality of part feeders which are component supply devices are installed in parallel in the component supply units 7F and 7R. Feeder addresses "f1, f2, f3 . . . ", and "r1, r2, r3 . . . " for specifying mounting positions of those part feeders are set in the component supply units 7F and 7R, and those feeder addresses are specified so that the part feeders mounted in the component mounting devices can be specified, individually.

In this example, tape feeders 8 each having a function of pitch-feeding a carrier tape that holds the electronic component to be mounted are installed as the part feeders. The component supply units 7F and 7R drive the tape feeders 8 to supply the electronic components to component adsorption positions by adsorption nozzles 12a of mounting heads 12 which will be described below.

A Y-axial travel table 10 having a linear drive mechanism is disposed on one end of an upper surface of the base 4 in the X-direction. Two X-axial travel tables 11 each having a linear drive mechanism likewise are coupled with the Y-axial travel table 10 so as to be movable in the Y-direction. Each of the mounting heads 12 is a multiple head having a plurality of retention heads, and as illustrated in FIG. 3, the adsorption nozzles 12a that adsorb and retain the electronic component, and are movable up and down, individually, are loaded on lower ends of the respective retention heads.

The Y-axial travel table 10 and the X-axial travel tables 11 are driven so that the mounting heads 12 travel in the X-direction and the Y-direction. As a result, those two mounting heads 12 extract the electronic components from the component adsorption positions of the tape feeders 8 of the respective corresponding component supply units 7F and 7R by the adsorption nozzles 12a, and transport and mount the electronic components onto the mounting point of the substrate 6 positioned by the substrate transport mechanism 5. The Y-axial travel table 10, the X-axial travel tables 11, and the mounting heads 12 each configure a component mounting mechanism 13 that travels the mounting head 12 retaining the electronic components to transport and mount the electronic component onto the substrate 6.

A component recognition camera 9 is arranged between each of the component supply units 7F and 7R, and the substrate transport mechanism 5. When the mounting head 12 that has extracted the electronic component from each of the component supply units 7F and 7R travels above the component recognition camera 9, the component recognition camera 9 images and recognizes the electronic component retained by the mounting head 12. A substrate recognition camera 14 that is located on a lower surface side of each X-axial travel table 11, and travels integrally with the mounting head 12 is loaded in each of the mounting heads 12. With the travel of the mounting head 12, the substrate recognition camera 14 travels above the substrate 6 positioned by the substrate transport mechanism 5, and images and recognizes the substrate 6. In the component mounting operation on the substrate 6 by the mounting head 12, a mounting position correction is conducted taking the recognition result of the electronic component by the component recognition camera 9, and the substrate recognition result by the substrate recognition camera 14 into account.

As illustrated in FIG. 3, a carriage 15 in which the plurality of tape feeders 8 is loaded on a feeder base 15a in advance is set in each of the component supply units 7F and 7R. The feeder base 15a is clamped on a fixed base 4a disposed on the base 4 by a clamp mechanism 15b so that a position of the carriage 15 is fixed in each of the component supply units 7F and 7R. Supply reels 16-1 and 16-2 that store carrier tapes 17-1 and 17-2 retaining the electronic components in a winding state, respectively, are retained in the carriage 15. The carrier tapes 17-1 and 17-2 extracted from the supply reels 16-1 and 16-2 are pitch-fed to a pickup position of the adsorption nozzles 12a by the tape feeders 8.

The supply reels 16-1 and 16-2 are attached with bar code labels 16-1a and 16-2a imprinting component ID codes indicative of a component type and production lot information of the electronic components retained by the carrier tapes 17-1 and 17-2. The bar code labels 16-1a and 16-2a are read by a bar code reader 36 (refer to FIG. 5), thereby being capable of identifying the type of electronic components supplied by the tape feeders 8.

Figure 4:
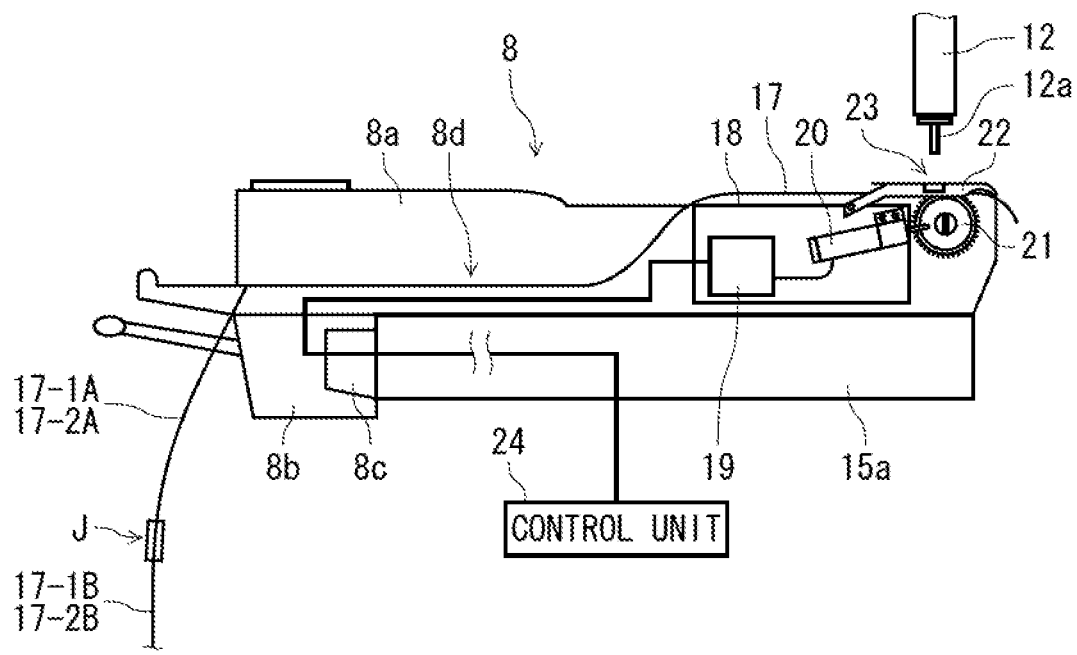
FIG. 4 is an illustrative diagram of a configuration of a tape feeder used in the method of manufacturing the mounting substrate according to the embodiment of the present invention.

Subsequently, a configuration and a function of the tape feeders 8 will be described with reference to FIG. 4. As illustrated in FIG. 4, each of the tape feeders 8 is configured to include a main body portion 8a and a mounting portion 8b protruded downward from a lower surface of the main body portion 8a. In a state where the tape feeder 8 is loaded so that a lower surface of the main body portion 8a is along the feeder base 15a, a connector portion 8c disposed on the mounting portion 8b is fitted to the feeder base 15a. As a result, the tape feeders 8 are fixedly loaded in the component supply units 7F and 7R, and the tape feeders 8 are electrically connected to control units 24 (refer to FIG. 5) of the component mounting devices M4 and M5.

Within the main body portion 8a, a tape travel path 8d that guides the carrier tapes 17-1 and 17-2 extracted from the supply reels 16-1 and 16-2, and taken into the main body portion 8a is continuously extended from a rear end of the main body portion 8a to a front end thereof. The component mounting devices M4 and M5 according to this embodiment each employ a tape splicing system. That is, in the component mounting devices M4 and M5, tailing ends of first carrier tapes 17-1A and 17-2A that have already been loaded on the tape feeders 8 are joined to leading ends of second carrier tapes 17-1B and 17-2B which are newly loaded when the components are short, with the use of joining tapes by a joint portion J. As a result, the carrier tapes 17-1 and 17-2 are continuously supplied to the tape feeders 8 without any interruption caused by the replacement of the supply reels 16-1 and 16-2.

That is, in the component mounting devices M4 and M5 according to this embodiment, the carrier tapes 17-1 and 17-2 that retain the electronic components are first loaded in the tape feeders 8 arrayed in the component supply units 7F and 7R. Then, the carrier tapes 17-1 and 17-2 are pitch-fed while repeating the splicing operation of joining the first carrier tapes 17-1A and 17-2A that have already been loaded in the tape feeders 8 to the second carrier tapes 17-1B and 17-2B that are newly supplied by the joining tapes. With this operation, the electronic components supplied to the pickup position are extracted by the mounting heads 12, and mounted on the substrate 6.

A tape feeding unit 18 for pitch-feeding the carrier tapes 17-1 and 17-2 is incorporated into the main body portion 8a. The tape feeding unit 18 includes a tape feed motor 20 that rotatably drives a tape feeding sprocket 21 disposed on a leading end of the tape travel path 8d, and a feeder control unit 19 that controls the tape feed motor 20. The feeder control unit 19 is connected to the control unit 24 of the device main body. A storage device incorporated into the feeder control unit 19 stores a feeder ID code for identifying and specifying the tape feeder 8 from the others therein. The tape feeders 8 are loaded into the feeder base 15a whereby the control units 24 can identify the respective tape feeders 8, individually.

The tape feed motor 20 is controlled by the feeder control unit 19 to intermittently rotate the tape feeding sprocket 21 so that the carrier tapes 17-1 and 17-2 are pitch-fed toward the downstream side. On a front side of the sprocket 21 is a component adsorption position at which the electronic components are vacuum-adsorbed and extracted from the carrier tapes 17-1 and 17-2 by the adsorption nozzles 12a of the mounting heads 12. A holding member 22 that holds the carrier tapes 17-1 and 17-2 from upper surface sides thereof, and guides the carrier tapes 17-1 and 17-2 is arranged on an upper surface side of the main body portion 8a close to the sprocket 21. An adsorption opening portion 23 is disposed in the holding member 22 in correspondence with pickup positions due to the adsorption nozzles 12a. The electronic components retained by the carrier tapes 17-1 and 17-2 are exposed to above in the adsorption opening portion 23, and the components can be extracted by the adsorption nozzles 12a of the mounting heads 12.

Figure 5:
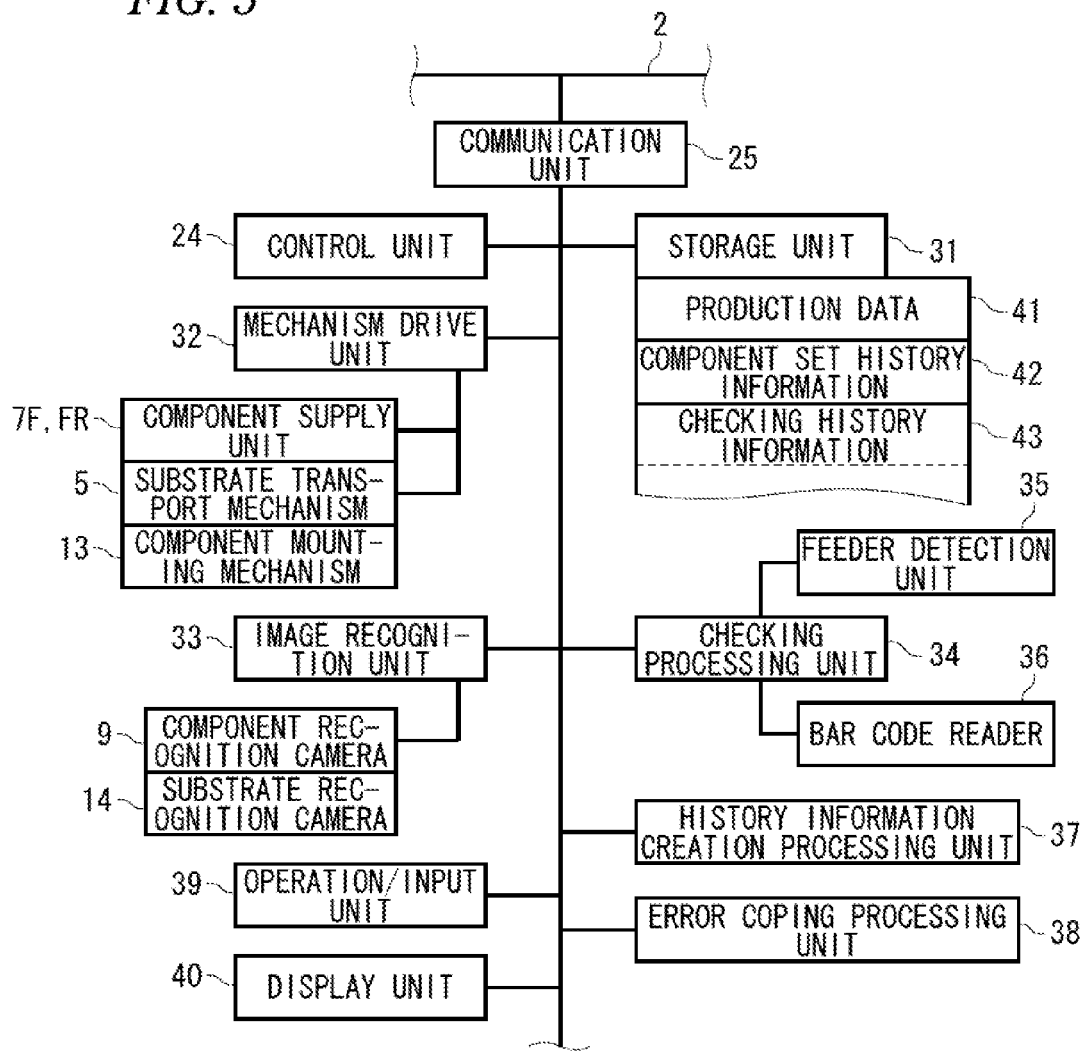
FIG. 5 is a block view illustrating a configuration of a control system in the component mounting device used in the method of manufacturing the mounting substrate according to the embodiment of the present invention.

Subsequently, a configuration of the control system will be described with reference to FIG. 5. Referring to FIG. 5, the control unit 24 is a processing arithmetic device, and executes a variety of programs stored in a storage unit 31, to thereby control the respective units described below, and cause the component mounting devices M4 and M5 to execute the work operation and a variety of processing. The storage unit 31 stores a mounting operation program and mounting data necessary for the component mounting operation as well as production data 41, component set history information 42, and checking history information 43 therein. When the control unit 24 controls the respective units, the above-mentioned various programs and various data stored in the storage unit 31 are referred to.

Now, the production data 41, the component set history information 42, and the checking history information 43 will be described with reference to FIGS. 6A to 6C. The production data 41 are data that defines, in advance, a feeder ID code 41F which specifies a feeder type and a serial number of the part feeders loaded at the respective feeder addresses 7A, and a component ID code 41P which specifies a component type and a production lot of the electronic components stored by the part feeders, in the component mounting operation for a specific substrate type (substrate type B1 in this example).

In an example illustrated in FIG. 6A, "Faaaa" is shown as the feeder ID code 41F indicative of the tape feeder 8 to be loaded, and "Pbbbb" is shown as the component ID code 41P to be set, in correspondence with "f1" in the feeder address 7A. Similarly, the feeder ID code 41F and the component ID code 41P are defined in "f2", "f3" and so on of the feeder address 7A. The production data 41 is created in advance, considering the efficiency of the operation efficiency of the component mounting operation per se, and the efficiency of the standby operation such as the feeder position change associated with the substrate type switching comprehensively. When the component mounting operation starts, the feeder array operation is executed on the basis of the production data 41.

As illustrated in FIG. 6B, the component set history information 42 is information for storing a history set to replenish the electronic component in a component mounting process for one substrate type which is executed in the component mounting device. The component set history information 42 is a data configuration that links a component set timing at which the electronic component is set in the part feeder with the identification information of the electronic component which is set in the part feeder, and supplied to the component mounting mechanism 13, and the feeder address 7A indicative of the loading position of the part feeder.

That is, as illustrated in FIG. 6B, in "f1" of the feeder address 7A, like the feeder ID code 41F and the component ID code 41P defined in the production data 41, "Faaaa" and "Pbbbb" are indicated as a feeder ID code 42F and a component ID code 42P, respectively. In this example, the electronic component in which the component ID code 42P is "Pbbbb" is set for the component replenishment at timing when the component set timing 42T is "Tssss". Also, in the component set history information 42, a correspondence substrate ID code 42B that specifies the substrate 6 to be subjected to the component mounting operation is stored together at the above timing.

In the example shown, "B1nnnn" indicating that the substrate type is "B1", and the serial number is "nnnn" is described as a corresponding substrate ID code 42B, and the substrate 6 specified by the substrate ID code is to be operated at the component set timing. Similarly, in "f2", "f3", and so on of the feeder address 7A, the component set timing 42T and the corresponding substrate ID code 42B are stored in the corresponding feeder ID code 42F, and component ID code 42P.

As illustrated in FIG. 6C, the checking history information 43 is history information for storing the result of the component checking processing executed for the purpose of checking whether the electronic component supplied from the respective feeder addresses 7A of the component supply units 7F and 7R are regular component types defined by the production data 41 in advance, or not, in the component mounting device. The component checking processing is conducted by detecting the component ID code which is the identification information of the electronic component, and checking the component ID code against the production data 41 by a checking processing unit 34 at a given timing set in the component mounting process in advance, for each of the tape feeders 8 loaded in the component supply units 7F and 7R.

The control unit 24 determines whether the above electronic component is the regular electronic component to be supplied from the tape feeder 8 loaded in the feeder address 7A, or not, according to the checking result of the checking processing unit 34. If it is determined that the above electronic component is the regular electronic component, the control unit 24 links the checking timing when the checking is executed for the tape feeder 8 with the component ID code and the feeder address 7A, and stores the checking timing as the checking history information. A corresponding substrate ID code 43B that specifies the substrate 6 to be subjected to the component mounting operation at the checking timing is stored in the checking history information 43 together.

In the example shown, "B1mmm" indicating that the substrate type is "B1", and the serial number is "mmmm" is described as a corresponding substrate ID code 43B, and the substrate 6 specified by the substrate ID code is to be operated at the component set timing. Similarly, in "f2", "f3", and so on of the feeder address 7A, a checking timing 43T and the corresponding substrate ID code 438 are stored in the corresponding feeder ID code 43F, and component ID code 43P.

A mechanism drive unit 32 is controlled by the control units 24 to drive the component supply units 7F, 7R, the substrate transport mechanism 5, and the component mounting mechanism 13. As a result, the component mounting operation is executed in the component mounting device M4. An image recognition unit 33 recognizes the imaging results of the component recognition camera 9 and the substrate recognition camera 14. As a result, the identification and the position recognition of the electronic component held by the mounting head 12, and the component mounting position on the substrate 6 are recognized. The checking processing unit 34 conducts component checking processing for checking whether the feeder type of the tape feeders 8 loaded in the component supply units 7F and 7R, and the component type of the electronic components supplied by the tape feeders 8 match the regular feeder type and component type defined by the production data 41, or not.

This component checking processing is conducted by using any one or both of the tape feeders 8, and the electronic components to be supplied by the tape feeders 8. That is, the checking processing unit 34 conducts the above-mentioned component checking processing as follows, on the basis of the identification result of the tape feeders 8 by a feeder detection unit 35, or an identification result (in other words, identification result of the component type) of the supply reels 16-1 and 16-2 by the bar code reader 36.

First, the feeder detection unit 35 conducts the detection that the tape feeders 8 are loaded in the component supply units 7F and 7R, and identification of the loaded tape feeder 8. That is, when the tape feeders 8 are loaded into the feeder base 15*a* illustrated in FIG. 4 whereby the feeder control unit 19 of the tape feeders 8 is connected to the control units 24 to read the feeder IC code stored in the feeder control unit 19. As a result, the tape feeders 8 are identified, and the identification results are transmitted to the checking processing unit 34. Then, the checking processing unit 34 checks the identification result against the production data 41 to determine whether the tape feeder 8 to be identified is the regular tape feeder 8 to be loaded at the feeder address 7A to be checked, or not.

Also, the operator operates the bar code reader 36, reads the bar code labels 16-1*a* and 16-2*a* of the supply reels 16-1 and 16-2 set in the tape feeder 8 to be identified, and transmits the read result to the checking processing unit 34. Then, the checking processing unit 34 checks the read result against the production data 41 to determine whether the electronic component set in the tape feeder 8 to be identified is the regular electronic component to be mounted on the tape feeder 8 to be checked, or not.

In the above-mentioned component checking processing, whether the tape feeders 8 or the electronic component supplied by the tape feeders 8 is to be identified, or both of them are used is appropriately selected according to the actual condition of the production line. That is, the identification target can be appropriately selected according to an operation mode or a check method when the supply reels 16-1 and 16-2 are replaced with others in the tape feeders 8. For example, the selection may be conducted so that the effects due to the checking processing implementation are most effectively obtained according to the individual method examples such as the reel replacement system or the tape splicing system. In this example, the reel replacement system is a system in which when in replacement of the supply reels 16-1 and 16-2 due to shortage, the tape feeders 8 are removed from the feeder base 15*a* once, and new supply reels 16-1 and 16-2 are loaded. The tape splicing system is a system in which the carrier tapes 17-1 and 17-2 are joined together to replace the old and new supply reels 16-1 and 16-2 with each other while continuing the device operation without removing the tape feeders 8.

A history information creation processing unit 37 conducts processing for creating the above-mentioned component set history information 42, and checking history information 43. That is, the history information creation processing unit 37 edits the operation information acquired by allowing the control unit 24 to control the respective units, according to a given data processing format, as a result of which the component set history information 42 and the checking history information 43 of the above-mentioned contents are created, and stored in the storage unit 31, and sequentially updated.

An error coping processing unit 38 conducts the error coping processing required when an error is generated at a preset given timing in a process of continuously executing the component mounting operation. For example, if it is determined that the electronic component is the different type of component which is not the regular electronic component to be supplied from the tape feeder 8 loaded at the loading position, the error coping processing unit 38 indicates a method such as display by a display unit 40 as the error coping processing.

An operation/input unit 39 is an input device such as a touch panel switch set in a keyboard or a display panel provided on a control panel, and conducts an operation command input and a data input necessary for the device operation. The display unit 40 displays a variety of alarms necessary at the time of conducting the normal operation of the device, and displays the checking processing result by the checking processing unit 34, or instruction items necessary for execution of the error coping by the error coping processing unit 38.

Subsequently, a description will be given of electronic component mounting operation processing which is executed in the electronic component mounting system 1 with reference to a flowchart of FIG. 7. First, as standby operation prior to the mounting operation start, the control unit 24 conducts the production data read and component setting (ST1). That is, the control unit 24 reads the production data 41 on the substrate 6 to be produced from the storage unit 31, and displays the production data 41 on the display unit 40. The operator loads the tape feeders 8 in which the electronic components of a given component type are set at the feeder address 7A of the component supply units 7F and 7R, according to the production data 41 displayed on the display unit 40.

If the setting of the electronic components in the component supply units 7F and 7R are completed, the control unit 24 stores the component set history information therein (ST2). That is, the control unit 24 detects the feeder loading by the feeder detection unit 35 in each of the tape feeders 8, executes the data processing by the history information creation processing unit 37 on the basis of the detection results to create the component set history information, and stores the component set history information in the storage unit 31. Then, the control unit 24 executes the component matching process at the time of completing the operation preparation (ST3).

Figure 8:
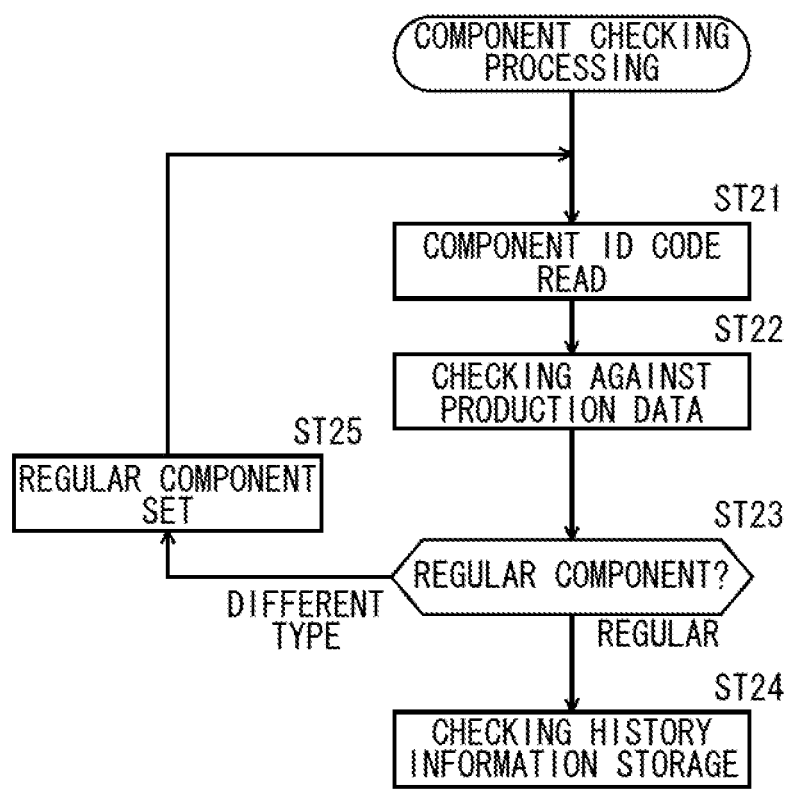
FIG. 8 is a flowchart illustrating component checking processing in the method of manufacturing the mounting substrate according to the embodiment of the present invention.

In the component checking processing, the operator passes the bar code labels 16-1*a* and 16-2*a* (refer to FIG. 3) of the supply reels 16-1 and 16-2 loaded in the respective tape feeders 8 over the bar code reader 36. In this situation, as illustrated in FIG. 8, the component ID codes indicated on the bar code labels 16-1*a* and 16-2*a* are read by the bar code reader 36 (ST21). Then, the read result is checked against the production data 41 by the checking processing unit 34 (ST22). The control unit 24 determines whether the subject component is the regular component defined by the production data 41, or not, according to the checking result (ST23).

In this situation, if it is determined that the subject component is the regular component, the control unit 24 writes the time as the checking timing in the checking history information 43, and stores the time in the storage unit 31 (ST24). Also, if it is determined that the subject component is not the regular component but the different type of component, according to the checking result, the control unit 24 replaces the supply reels 16-1 and 16-2 determined as the different type of component with fresh ones to set the regular components (ST25). Then, the control unit 24 again returns to (ST21), repeats the following processing, confirms that the subject component is the regular component in (ST23), and thereafter stores the result as the checking history information therein, likewise (ST24).

Figure 7:
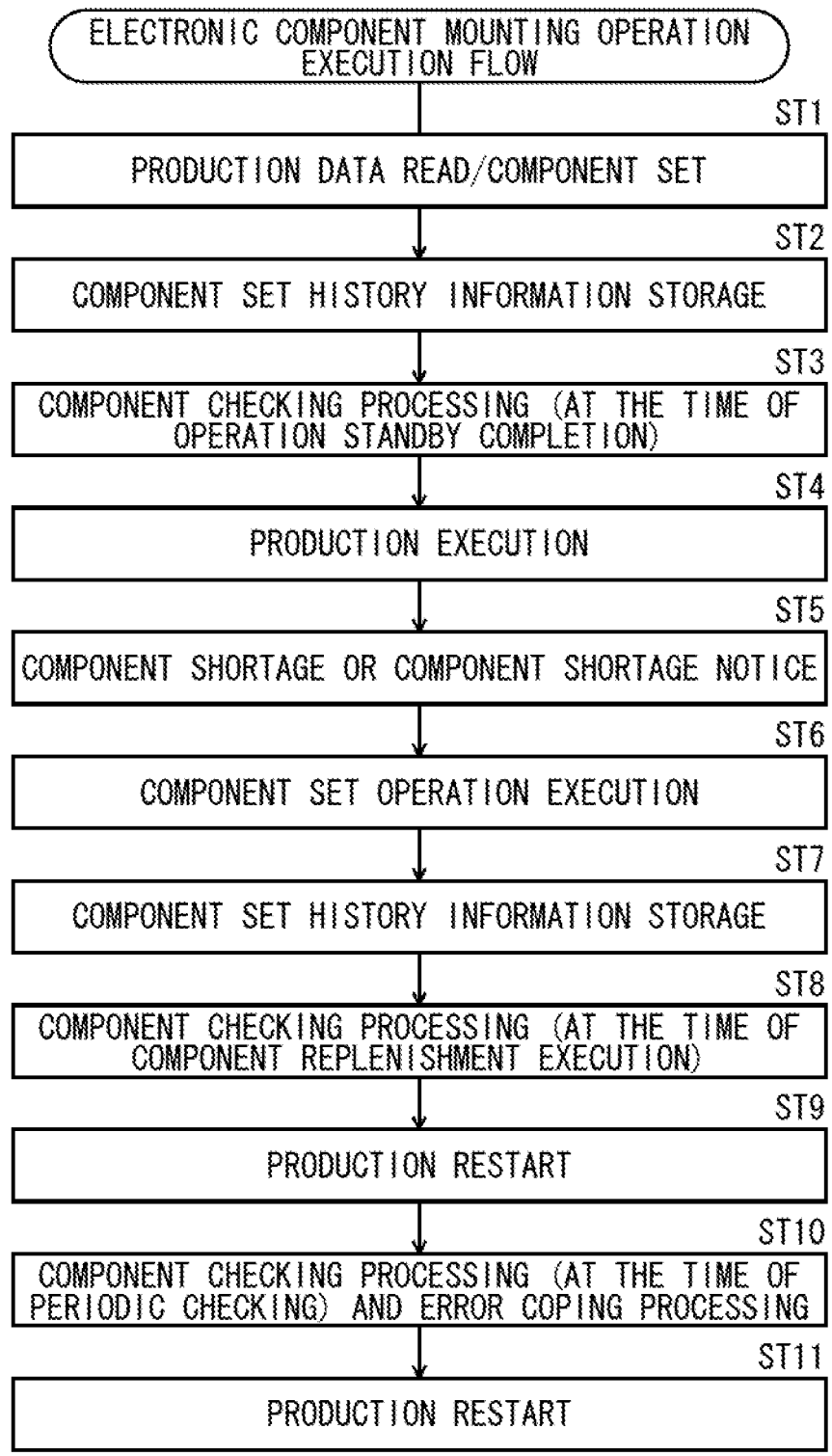
FIG. 7 is a flowchart illustrating electronic component mounting operation execution processing in the method of manufacturing the mounting substrate according to the embodiment of the present invention.

Thereafter, the control unit 24 returns to the flaw of FIG. 7, and executes the production of the component mounting (ST4). Then, in the process of continuing the component mounting operation, when the component shortage or a component shortage notice is generated in any of the tape feeders 8 (ST5), the control unit 24 executes the component set operation for replenishing the component for the tape feeders 8 (ST6). That is, the control unit 24 generates the component shortage notice by display on the display unit 40 if the remaining number of components in the loaded supply reels 16-1 and 16-2 is reduced more than a regular amount. The operator receives the component shortage notice, executes the tape splicing operation for joining the loaded carrier tapes to carrier tapes of new supply reels 16-1 and 16-2, and also loads the new supply reels 16-1 and 16-2 instead of the loaded supply reels 16-1 and 16-2. Then, the control unit 24 creates the component set history information indicative of the contents of the component set operation and the execution timing by the history information creation processing unit 37, stores the component set history information in the storage unit 31, and updates the component set history information 42 (ST7).

Then, the control unit 24 executes the component checking processing at the time of executing the component replenishment (ST8). This component checking processing is conducted pursuant to the component checking processing executed in the above-mentioned (ST3). At the time of executing the component replenishment, the component ID codes are read for the loaded supply reels 16-1, 16-2, and the new supply reels 16-1, 16-2. That is, with the use of the bar code reader 36 and the checking processing unit 34, the bar code labels 16-1*a* and 16-2*a* of the loaded supply reels 16-1 and 16-2 are read, and checked against the production data 41. Then, the bar code labels 16-1*a* and 16-2*a* of the new supply reels 16-1 and 16-2 are read, and checked against the production data 41. Then, the control unit 24 restarts the production of the component mounting if it is confirmed that the components on both of the supply reels 16-1 and 16-2 are also the regular components (ST9).

Then, when the operation reaches a given timing which is set as a timing of the checking execution in advance in the process of continuing the component mounting operation, the control unit 24 allows the checking processing unit 34 to execute the component checking processing illustrated in FIG. 8 on the respective tape feeders 8, and as occasion demands, allows the error coping processing unit 38 to execute the error coping processing (ST10). In this example, a predetermined interval progression is applied as the given timing at which the component checking process is to be executed, and the component checking processing is periodically executed for each interval progression.

The given timing is a reel replacement time when replacing the supply reels 16-1 and 16-2 that winds up the carrier tapes 17-1 and 17-2 in the tape feeders 8 with others, or a tape splicing execution time when joining the existing carrier tapes to new carrier tapes. In the example illustrated in FIG. 7, the component checking processing is conducted at the time of both of the tape splicing execution and the interval progression. Then, in the component checking processing executed at the above-mentioned set given timing, if it is determined that the electronic component is the different type of component which is not the regular electronic component to be supplied from the part feeder loaded at the loading position, the control unit 24 executes the error coping processing which will be described below.

FIG. 9 illustrates the error coping processing when the different type of component is detected in the component checking process. That is, when the different type of component different form the regular component defined by the production data 41 is detected, the control unit 24 stops the production operation of the component mounting device loaded with the part feeder in which the different type of component is set, in order to immediately sever the generation of the erroneous mounting (first device stopping step) (ST31). When the error is generated, the error coping processing is displayed on the display unit 40 by the error coping processing unit 38. The error coping processing unit 38 may initiatively execute the error coping processing instead of the control unit 24. Then, the control unit 24 specifies the component set timing at which the different type of component is set, on the basis of the component set history information 42 stored in the storage unit 31 (timing specifying step) (ST32).

Then, the control unit 24 specifies all of the substrates to be target of production by the subject component mounting device after the specified component set timing as substrates to be managed on which the different type of component is potentially mounted (substrate specifying step) (ST33). The specification of the substrates to be managed is conducted by specifying the substrate ID of the substrate 6 to be target of production by the subject component mounting device after the component set timing specified in (ST32) with reference to the component set history information 42.

That is, in the feeder address 7A at which the different type of component is detected in the component checking, the component set timing 42T of the component is acquired by retroactively applying the component set history to identify the corresponding substrate ID code 42B corresponding to the component set timing 42T. Then, the substrate having the ID code after the corresponding substrate ID code 42B is specified as the substrate to be managed. In this case, the substrate to be managed is specified by the substrate ID of the substrate to be target of production by the subject component mounting device after the specified component set timing.

In the specification of the substrate to be managed, the substrate to be managed may be specified by the number of substrates estimated on the basis of a standard production tact time when the substrate type is targeted by the subject device, instead of specifying the substrate to be managed with the use of the substrate ID code. That is, the number of substrates to be managed on which the different type of component may be potentially mounted can be estimated and calculated by dividing a time elapsed from the component set timing 42T acquired for the above component by the standard production tact time. In this case, the substrates to be managed are specified by the number of substrates to be target of production by the subject component mounting device after the specified component set timing.

If the substrate to be managed is thus specified, the control unit 24 stops the production operation of all the component mounting devices arranged downstream of the subject component mounting device, which are intended to produce the substrates to be managed (second device stop step) (ST34).

Also, the control unit 24 notifies the downstream step of the information on the substrates to be managed (ST35).

Then, on the downside side that receives this notification, coping is instructed by a given title holder having a decision-making power about the above situation in advance such as a line manager (ST36). For example, an appropriate procedure is selectively executed according to the situation, for example, such that all of the substrates to be managed are extracted from the component mounting line 1a, and fed to a repair area. Then, when the regular component is set instead of the different type of component detected by the component checking, the control unit 24 returns to the normal production operation (ST37).

This embodiment is premised on working conditions in which it is difficult to exclude an omission of duty that resultantly becomes a fraud operation regardless of whether the positive intension of the operator is present, or not. Accordingly, since it is actually impossible to specify the timing at which the different type of component is actually set in a strict sense, the last checking timing 43T of the checking OK at the feeder address 7A in the checking history information 43 may be used as the component set timing in (ST32). With this processing, the substrates to be managed on which the different type of component may be potentially mounted can be completely covered to improve the management reliability.

In the electronic component mounting operation execution flow illustrated in FIG. 7, (ST2) and (ST7) configure the component set history storing step of storing the identification information of the electronic components supplied by the part feeders, the loading position of the part feeder, and the component set timing at which the electronic component is set in the part feeder linked with each other as the component set history information, for each of the part feeders loaded on the component supply unit in the component mounting process intended for one substrate type.

Also, (ST3) and (ST8) configure the checking history information storing step of detecting identification information on the electronic components, and checking the identification information against production data to determine whether the electronic components are regular electronic components to be supplied from the part feeders loaded at the loading positions, or not, and storing the identification information on the electronic components, the loading positions, and the checking timing at which the checking is executed on the part feeders linked with each other as the checking history information if it is determined that the electronic component is the regular electronic component, for each of the part feeders loaded in the component supply unit at a preset given timing in the component mounting process.

Then, the error coping step described with reference to FIG. 9 is executed when it is determined that the electronic component is a different type of component which is not the regular electronic component to be supplied from the part feeder loaded at the loading position, at the preset given timing.

As has been described above, in the method of manufacturing the mounting substrate in the electronic component mounting system 1 according to this embodiment, in the error coping step which is executed when it is determined that the electronic component is the different type of component which is not the regular electronic component to be supplied from the part feeder loaded at the loading position at a predetermined given timing in the component mounting process, the production operation of the component mounting device loaded with the part feeder in which the different type of component is set is stopped, the component set timing at which the different type of component is set is specified on the basis of the component set history information, all of the substrates to be target of production by the component mounting device after the specified component set timing are specified as the substrates to be managed on which the different type of components are potentially mounted, and the production operation of all of the component mounting devices arranged downstream of the above component mounting device which are intended to produce the substrates to be managed is stopped. As a result, the coping method when the erroneous set of the electronic components is found is definitely specified, and the poor quality caused by the erroneous mounting can be prevented.

This embodiment shows an applied example in which the erroneous set of the electronic component in the component mounting device is targeted. The method according to this embodiment can be also applied to the supply of a material such as a screen mask, a squeegee component, and a solder paste in another device on the mounting substrate manufacturing line, for example, a screen printing device.

Various changes and applications of the present invention may be made by those skilled in the art on the basis of the description of this specification and known techniques without departing from the spirit and scope of the present invention, and these are also included in the range of the request for protection. In addition, the respective components in the embodiments described above may be arbitrarily combined without departing from the scope of the invention.

This invention is based on Japanese Patent Application (Japanese Patent Application No. 2012-182918) filed on Aug. 22, 2012, the content of which is incorporated herein by reference.

INDUSTRIAL APPLICABILITY

The method of manufacturing the mounting substrate according to the present invention has such advantages that the coping method when the erroneous set of the electronic components is found is definitely specified, and the poor quality caused by the erroneous mounting can be prevented, and is applicable to a field of manufacturing the mounting substrate in which the electronic component is mounted on the substrate.

REFERENCE SIGNS LIST

1, electronic component mounting system
6, substrate
7A, feeder address
7F, 7R, component supply unit
8, tape feeder
12, mounting head
13, component mounting mechanism
16-1, 16-2, supply reel
16-1a, 16-2a, bar code label
17-1, 17-2, carrier tape
M1, substrate supply device
M2, substrate delivery device
M3, solder printing device
M4, M5, component mounting device
M6, reflow device
M7, substrate recovery device

The invention claimed is:

1. A mounting substrate manufacturing method for manufacturing a mounting substrate by sequentially mounting a plurality of electronic components on a substrate by a component mounting line in which a plurality of component mounting devices that extract the electronic components from a component supply unit on which a plurality of part feeders are loaded, and mount the electronic components on the substrate are coupled to each other, the mounting substrate manufacturing method comprising:

- a component set history information storing step of storing identification information on the electronic components supplied by the part feeders, loading positions of the part feeders, and a component set timing at which the electronic components are set in the part feeders linked with each other as component set history information, for each of the part feeders loaded in the component supply unit in a component mounting process intended for one substrate type;
- a checking history information storing step of detecting identification information on the electronic components, and checking the identification information against production data to determine whether the electronic components are regular electronic components to be supplied from the part feeders loaded at the loading positions, or not, and storing the identification information on the electronic components, the loading positions, and the checking timing at which the checking is executed on the part feeders linked with each other as the checking history information if it is determined that the electronic component is the regular electronic component, for each of the part feeders loaded in the component supply unit at a preset given timing in the component mounting process; and
- an error coping step which is executed when it is determined that the electronic component is a different type of component which is not the regular electronic component to be supplied from the part feeder loaded at the loading position, at the preset given timing, wherein the error coping step includes:

- a first device stopping step of stopping production operation of the component mounting device in which the part feeders in which the different type of components is set is loaded;
- a timing specifying step of specifying the component set timing at which the different type of component is set, on the basis of the component set history information;
- a substrate specifying step of specifying all of the substrates to be target of production by the component mounting device after the specified component set timing as substrates to be managed on which the different type of component is potentially mounted; and
- a second device stop step of stopping the production operation of all the component mounting devices which are arranged downstream of the component mounting device, and which are intended to produce with the substrates to be managed.

2. The mounting substrate manufacturing method according to claim 1,
wherein in the error coping step, information on the substrates to be managed is notified to downstream processes.

3. The mounting substrate manufacturing method according to claim 1,
wherein the given timing is defined by a predetermined interval.

4. The mounting substrate manufacturing method according to claim 1,
wherein the part feeders are tape feeders that supply the electronic components by pitch-feeding carrier tapes which retain the electronic components, and
wherein the given timing is a reel replacement time when replacing a supply reel that winds up the carrier tapes in the tape feeder with others, or a tape splicing execution time when joining the existing carrier tapes to new carrier tapes.

5. The mounting substrate manufacturing method according to claim 1,
wherein the substrates to be managed are specified by substrate identification code of the substrate to be target of production by the component mounting device after the specified component set timing.

6. The mounting substrate manufacturing method according to claim 1,
wherein the substrates to be managed are specified by the number of substrates to be target of production by the component mounting device after the specified component set timing.

* * * * *